(12) United States Patent
Gordon (10) Patent No.: US 8,355,261 B2
(45) Date of Patent: Jan. 15, 2013

(54) SYSTEMS AND METHODS TO SECURE A CIRCUIT BOARD

(75) Inventor: Glen P. Gordon, Graham, WA (US)

(73) Assignee: Intel Corporation, Santa Clara, CA (US)

( * ) Notice: Subject to any disclaimer, the term of this patent is extended or adjusted under 35 U.S.C. 154(b) by 2127 days.

(21) Appl. No.: 10/854,612

(22) Filed: May 26, 2004

(65) Prior Publication Data

US 2005/0265007 A1    Dec. 1, 2005

(51) Int. Cl.
*H05K 5/00* (2006.01)
(52) U.S. Cl. ......................................................... 361/759
(58) Field of Classification Search .................. 370/463; 174/35; 235/472.02; 361/759, 755
See application file for complete search history.

(56) References Cited

U.S. PATENT DOCUMENTS

| | | | | |
|---|---|---|---|---|
| 5,113,913 | A * | 5/1992 | Graf | 139/91 |
| 5,721,669 | A * | 2/1998 | Becker et al. | 361/685 |
| 5,761,033 | A | 6/1998 | Wilhelm | |
| 6,173,843 | B1 * | 1/2001 | Christensen et al. | 211/41.17 |
| 6,272,009 | B1 * | 8/2001 | Buican et al. | 361/683 |
| 6,443,315 | B1 * | 9/2002 | Tabuchi | 211/41.17 |
| 6,490,153 | B1 * | 12/2002 | Casebolt et al. | 361/679.33 |
| 6,525,266 | B2 * | 2/2003 | Ferland et al. | 174/371 |
| 6,639,807 | B1 * | 10/2003 | Carney et al. | 361/759 |
| 6,671,181 | B2 * | 12/2003 | Kaminski | 361/759 |
| 6,809,922 | B2 * | 10/2004 | Lin et al. | 361/679.4 |
| 6,920,048 | B2 * | 7/2005 | Holt et al. | 361/726 |
| 7,079,555 | B2 * | 7/2006 | Baydar et al. | 370/532 |
| 2003/0007502 | A1 * | 1/2003 | Dove et al. | 370/463 |
| 2004/0182936 | A1 * | 9/2004 | Koenck et al. | 235/472.02 |
| 2005/0191870 | A1 * | 9/2005 | Holt et al. | 439/66 |

FOREIGN PATENT DOCUMENTS

TW        578969 Y    3/2004

* cited by examiner

*Primary Examiner* — Kambiz Zand
*Assistant Examiner* — Abiy Getachew
(74) *Attorney, Agent, or Firm* — Buckley, Maschoff & Talwalkar LLC (57) ABSTRACT

In some embodiments, a device includes a first element to couple the device to a first portion of a computer chassis; and a first pliant portion coupled to the first element and to inhibit disconnection of a circuit board. In some embodiments, a system includes a chassis having a circuit board slot coupled thereto; a circuit board coupled to the circuit board slot; and a device coupled to the chassis, the device having a first pliant portion to inhibit disconnection of the circuit board from the circuit board slot. In some embodiments, a system includes a chassis having a circuit board slot coupled thereto; a SONET interface card coupled to the circuit board slot; and a device coupled to the chassis, the device having a first pliant portion to inhibit disconnection of the SONET interface card from the circuit board slot.

22 Claims, 11 Drawing Sheets

SYSTEMS AND METHODS TO SECURE A CIRCUIT BOARD

BACKGROUND

Within computers and other electronic devices, circuit boards often must be connected, secured, or otherwise attached to various components. Circuit boards may be physically coupled to a structural component and/or electronically coupled to an electrical component (e.g., another circuit board). Proper functioning of an electronic device often depends upon the proper positioning and coupling of one or more circuit boards.

Circuit boards, such as expansion and/or interface cards, are typically secured in place with a metal screw. For example, a circuit board is initially positioned in a circuit board slot within a computer chassis. The circuit board may then be secured to the computer chassis by tightening a screw to couple a flange of the circuit board to the computer chassis. The use of a screw to prevent disconnection of the circuit board, particularly within computer systems, may present difficulties.

DETAILED DESCRIPTION

Figure 1:
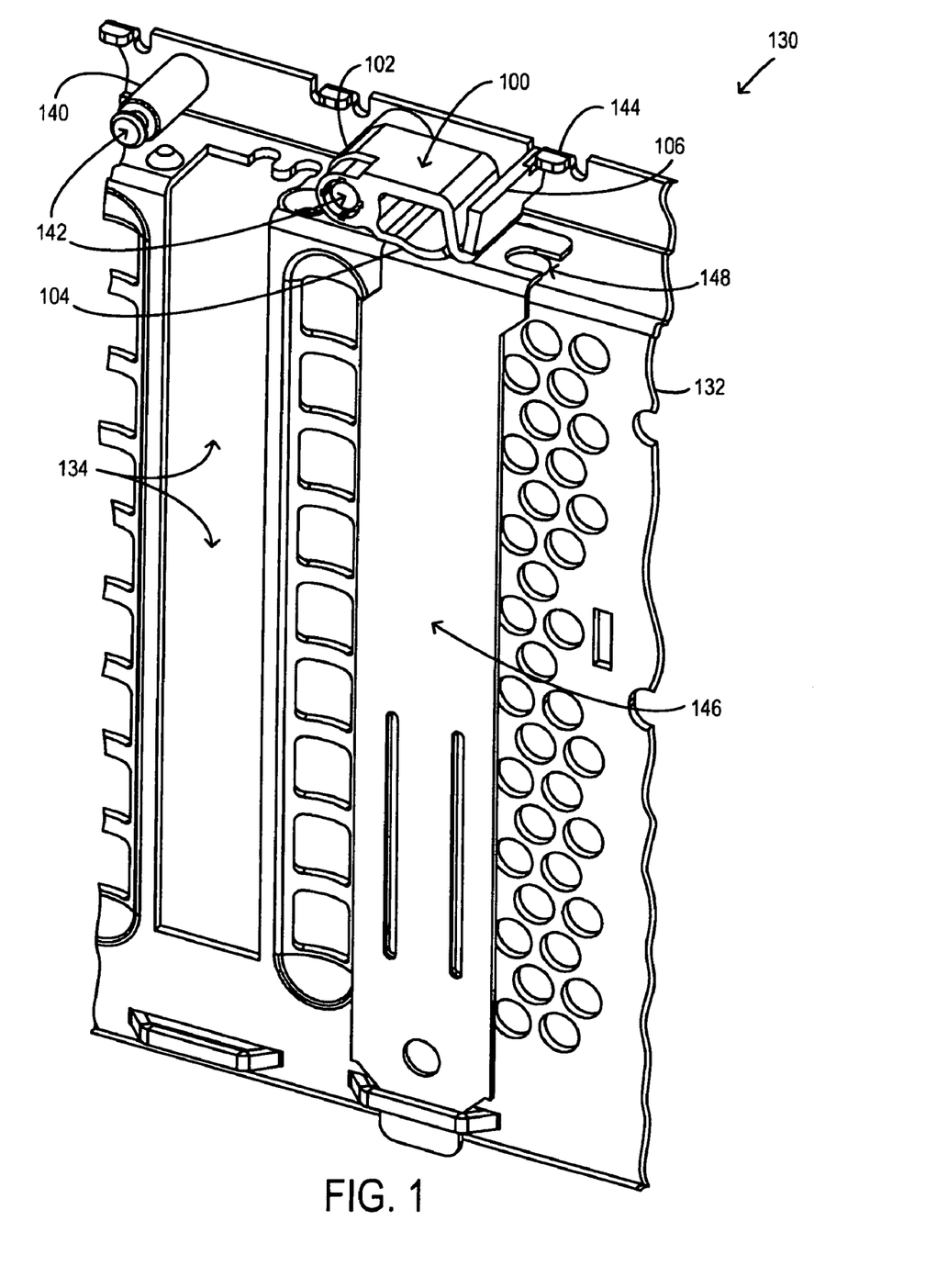
FIG. 1 is a perspective diagram of a device according to some embodiments.

Referring first to FIG. 1, a perspective diagram of a device 100 according to some embodiments is shown. The device 100 may, according to some embodiments, include a first element 102, a first pliant portion 104, and/or a second pliant portion 106. The device 100 may include fewer or more components than are shown in FIG. 1. For ease of illustration of some embodiments, the device 100 is shown in FIG. 1 in relation to a portion of a computer system 130. The device 100 and the system 130 are depicted for use in explanation, but not limitation, of some embodiments. Different types, layouts, quantities, and configurations of devices and/or systems may be used.

System 130 may comprise, according to some embodiments, a computer chassis 132 defining one or more mounting interfaces 134. The computer chassis 132 and the mounting interface 134 may be or include any types and/or configurations of computer chassis and mounting interface that are or become known. The computer chassis 132 may, for example, be the chassis for a computer server such as an IBM® eServer™ xSeries 455 server having a 4U form factor. According to some embodiments, the mounting interface 134 may be or include an expansion card and/or interface card slot such as a Peripheral Component Interconnect (PCI) slot as defined by the PCI Special Interest Group (SIG) in "PCI Local Bus Specification Revision 2.2" (Dec. 18, 1998), a PCI-X slot as defined by the PCI SIG in "PCI-X 2.0 Protocol and Electrical Specification" (May 1, 2002), and/or a PCI Express slot as defined by the PCI SIG in "PCI Express Specification 1.0a" (May 1, 2002).

According to some embodiments, the computer chassis 132 may include one or more projections such as a standoff 140. In some embodiments, the standoff 140 may be or include a keyed-standoff having a keyed portion 142. The keyed-standoff 140 may, for example, be or include a type of keyed-standoff used to secure motherboards and/or other computer components within computer systems. In some embodiments, the keyed-standoff 140 and/or another type or configuration of computer chassis projection may be located within, adjacent to, and/or near the mounting interface 134.

According to some embodiments, the device 100 may be coupled to the computer chassis 132 via a projection of the computer chassis 132, such as the keyed-standoff 140. For example, the device 100 may be mounted on the keyed-standoff 140 (as shown) by inserting the keyed-standoff 140 into an opening of the device 100. In some embodiments, the keyed-portion 142 of the keyed-standoff 140 may engage a lip within the opening of the device 100 to cause the device 100 to be removably coupled to the keyed-standoff 140. According to some embodiments, the first element 102 of the device 100 may define the opening and/or may be coupled to the keyed-standoff 140.

In some embodiments, the second pliant portion 106 of the device 100 may be coupled to a portion of the computer chassis 132. For example, the computer chassis 132 may, according to some embodiments, include a flange 144. The flange 144 may engage a portion of the device 100 to couple the device 100 to the computer chassis 132. In some embodiments, the second pliant portion 106 of the device 100 may, for example, be configured to couple to the flange 144. According to some embodiments, pressure may be applied to the second pliant portion 106 to disengage and/or uncouple the second pliant portion 106 from the computer chassis 132 and/or the flange 144.

According to some embodiments, the first pliant portion 102 of the device 100 may inhibit, prevent, and/or otherwise reduce the possibility of substantial movement and/or disconnection of a circuit board (not shown in FIG. 1) and/or a mounting interface cover 146. In some embodiments for example, a circuit board or a mounting interface cover 146 may be coupled to the mounting interface 134 of the computer chassis 132. The first pliant portion 102 may, according to some embodiments, be configured to apply pressure to a flange of the circuit board or the mounting interface cover 146 to couple the circuit board or mounting interface cover 146 to another element, such as to the mounting interface 134 and/or to a circuit board slot providing an electrical interface for the circuit board. In some embodiments, the mounting interface cover 146 may be secured in place by inserting a metal screw (not shown) into a screw hole 148 in the computer chassis 132. According to some embodiments (such as shown in FIG. 1), the screw hole 148 may be positioned to allow a metal screw to couple a flange of the mounting interface cover 146 to the computer chassis 132. In some embodiments, the device 100 and/or the first pliant portion 102 may be utilized instead of and/or in addition to the metal screw, to inhibit disconnection of the circuit board and/or mounting interface cover 146.

Figure 2A:
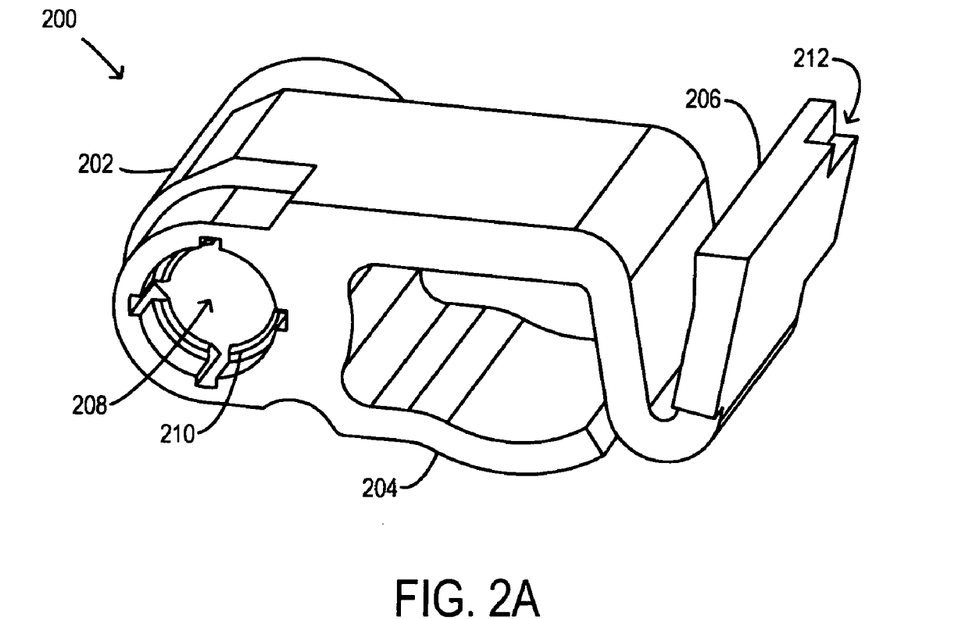
FIG. 2A is a front perspective diagram of a device according to some embodiments.
Figure 2B:
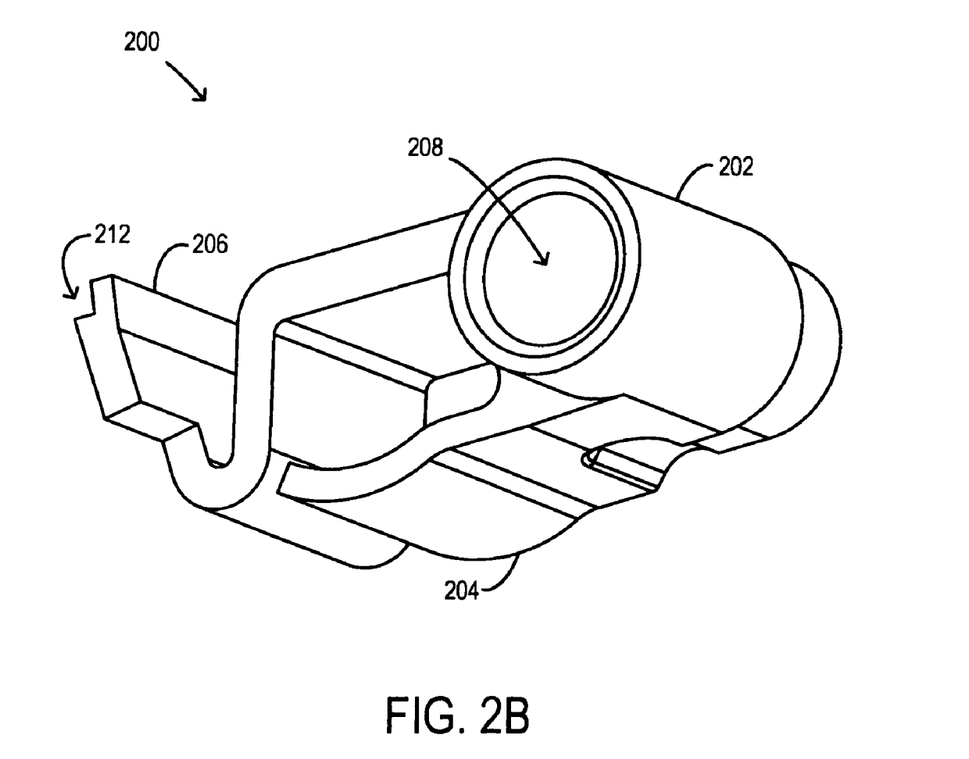
FIG. 2B is a rear perspective diagram of the device in FIG. 2A.

Referring now to FIGS. 2A and 2B, both front and rear perspective views of a device 200 are shown, respectively. In some embodiments, the device 200 may be similar to the device 100 as described in conjunction with FIG. 1 above. The device 200 may include, according to some embodiments, a first element 202, a first pliant portion 204, and/or a second pliant portion 206. In some embodiments, the components 202, 204, 206 of the device 200 may be similar in configuration and/or functionality to the similarly-named components described in conjunction with FIG. 1 above.

The first element 202 may, according to some embodiments, be configured to couple the device 200 to a computer chassis (such as chassis 132). In some embodiments, the first element 202 may be attached to, secured to, removably coupled to, and/or otherwise associated with the computer chassis. In some embodiments, the first element 202 of the device 200 may define an opening 208. In some embodiments (such as shown in FIGS. 2A and 2B), the opening 208 may be substantially circular in cross-section and/or may extend cylindrically through the first element 202. According to some embodiments, the opening 208 may be or include any cross-section and/or configuration that is or becomes practicable. As described in conjunction with FIG. 1 above, the opening 208 may be configured according to some embodiments to accept a projection.

Such a projection may be coupled to a computer chassis. For example, the opening 208 may be configured to receive a standoff and/or a keyed-standoff (such as keyed-standoff 140). In some embodiments, the keyed-standoff may be attached to, coupled to, and/or otherwise associated with the computer chassis. According to some embodiments, the opening 208 may be configured as a key-hole opening to accept a keyed-object (such as the keyed-portion 142 of the keyed-standoff 140). For example, the device 200 may include a lip 210 within the opening 208. The lip 210 may be configured, for example, to accept the keyed-portion 142 of the keyed-standoff 140. In some embodiments, insertion of the keyed-standoff into the opening 208 may cause and/or allow the keyed-portion of the keyed-standoff to be engaged with the lip 210. The engagement of the keyed-portion with the lip 210 may, according to some embodiments, cause the device 200 to be removably coupled to the keyed-standoff and/or other computer chassis projection.

According to some embodiments, the first element 202 may be coupled to the first pliant portion 204. The first pliant portion 204 may, according to some embodiments, be configured to inhibit disconnection of a circuit board (not shown in FIGS. 2A or 2B). The first pliant portion 204 may, for example, apply pressure to a portion of a circuit board to inhibit disconnection of the circuit board. In some embodiments for example, the first pliant portion 204 may apply pressure to a flange of a circuit board and/or a mounting interface cover (such as mounting interface cover 146) to couple the circuit board and/or mounting interface cover to a computer chassis (such as computer chassis 132) and/or to a circuit board slot disposed within the computer chassis.

In some embodiments, the device 200 may further include a second pliant portion 206 coupled and/or connected to the first element 202. According to some embodiments, the second pliant portion 206 may also or alternatively be coupled and/or connected to the first pliant portion 204. The second pliant portion 206 may, according to some embodiments, be configured to couple the device 200 to a computer chassis. In some embodiments, the second pliant portion 206 may couple to a part, portion, and/or component of the computer chassis different from that to which the first element 202 is coupled.

According to some embodiments, the second pliant portion 206 may define and/or include an interface 212. The interface 212 may, for example, permit the second pliant portion 206 to be coupled to the computer chassis. In some embodiments, the interface 212 may engage a portion of the computer chassis such as a flange (e.g., flange 144). Pressure may then be applied, for example, to the second pliant portion 206 to uncouple and/or disengage the interface 212 from the computer chassis flange. In some embodiments, the interface 212 may be or include an indentation, a hole, a notch, a projection, and/or any other configuration that is or becomes practicable.

Figure 3A:
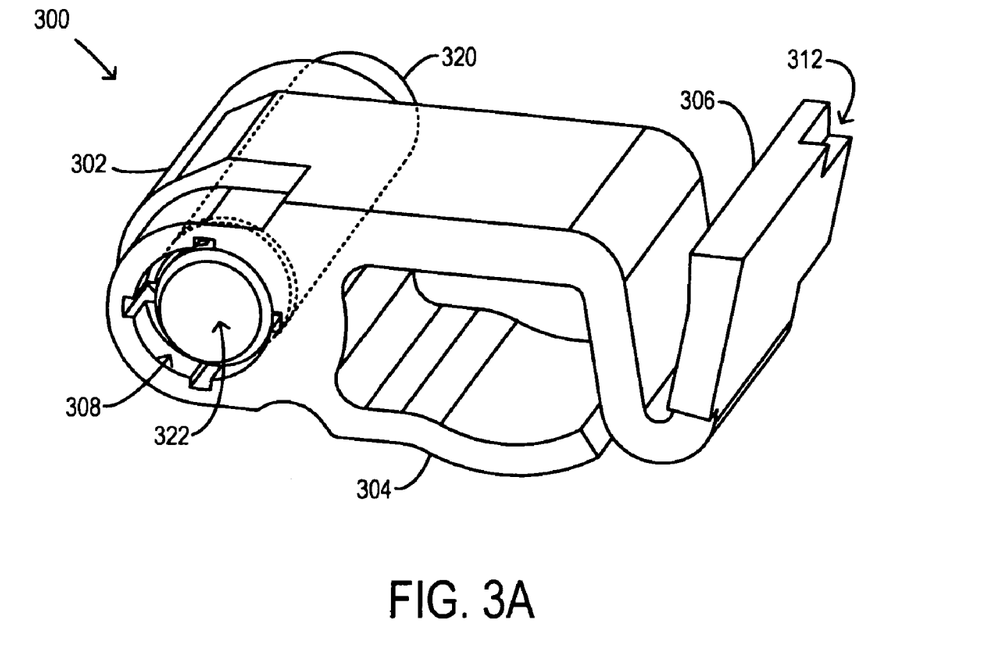
FIG. 3A is a front perspective diagram of a device according to some embodiments.
Figure 3B:
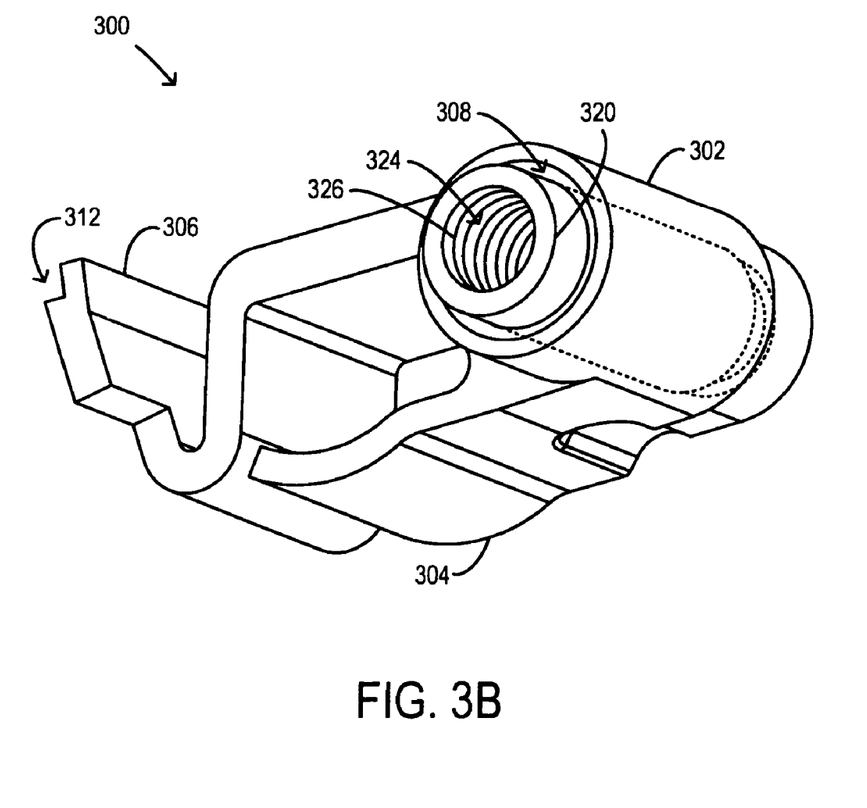
FIG. 3B is a rear perspective diagram of the device in FIG. 3A.

Turning now to FIGS. 3A and 3B, both front and rear perspective views of a device 300 are shown, respectively. In some embodiments, the device 300 may be similar to any of the devices 100, 200 described in conjunction with FIGS. 1 and FIGS. 2A and 2B, respectively above. The device 300 may include, according to some embodiments, a first element 302, a first pliant portion 304 connected to the first element 302, and/or a second pliant portion 306 connected to the first element 302. In some embodiments, the first element 302 may include and/or define an opening 308 and/or the second pliant portion 306 may include an interface 312. According to some embodiments, the components 302, 304, 306, 308, 312 of the device 300 may be similar in configuration and/or functionality to the similarly-named components described in relation to any of the devices 100, 200 described above.

In some embodiments, the device 300 may include a second element 320. The second element 320 may, for example, be configured to couple and/or facilitate coupling of the device 300 to a computer chassis. In some embodiments, the second element 320 may be connected and/or coupled to the first element 302. For example, the second element 320 may be or include an object and/or device that is configured to be at least partially disposed within the opening 308 defined by the first element 302. According to some embodiments, the second element 320 may be or include a standoff such as a keyed-standoff as described herein. For example, the second element 320 may include a keyed-portion 322. In some embodiments, the keyed-portion 322 may be similar in design and/or functionality to the keyed-portion 142 of the keyed-standoff 140 as described in conjunction with FIG. 1 above.

For example, the second element 320 may be a keyed-standoff that is coupled to the first element 302 by inserting the second element 320 into the opening 308 defined by the first element 302. The keyed-portion 322 of the second element 320 may, for example, engage a lip and/or other device within the opening 308 to removably couple the first element 302 to the second element 320. In some embodiments, the coupling of the first element 302 and the second element 320 may allow the first element 302 to be rotated with respect to the second element 320. For example, the second element 320 may be capable of rotation within the opening 308 defined by the first element 302. In some embodiments, fewer or more components then are shown in FIGS. 3A and 3B may be included in device 300. In some embodiments for example, a bearing, bushing, and/or other device may be included in device 300 to facilitate rotation of the first element 302 with respect to the second element 320. According to some embodiments, the second element 320 may be or include any type and/or configuration of device that facilitates and/or permits coupling of the device 300 to a computer chassis and/or other device.

In some embodiments or example, the second element 320 may define an opening 324. The opening 324 may be configured, according to some embodiments, to couple to the computer chassis. In some embodiments, the opening 324 may include threads 326 to receive a screw (not shown). The screw may be inserted into a hole in the computer chassis and threaded into the opening 324, for example, to attach, connect, and/or couple the second element 320 to the computer chassis. Opening 324 may include any structure and/or configuration suitable for coupling device 300 to a portion of a computer chassis and/or other device. In some embodiments for example, the opening 324 may be or include a projection (such as a keyed projection), a device, and/or any other type of object and/or interface suitable for coupling.

Figure 4A:
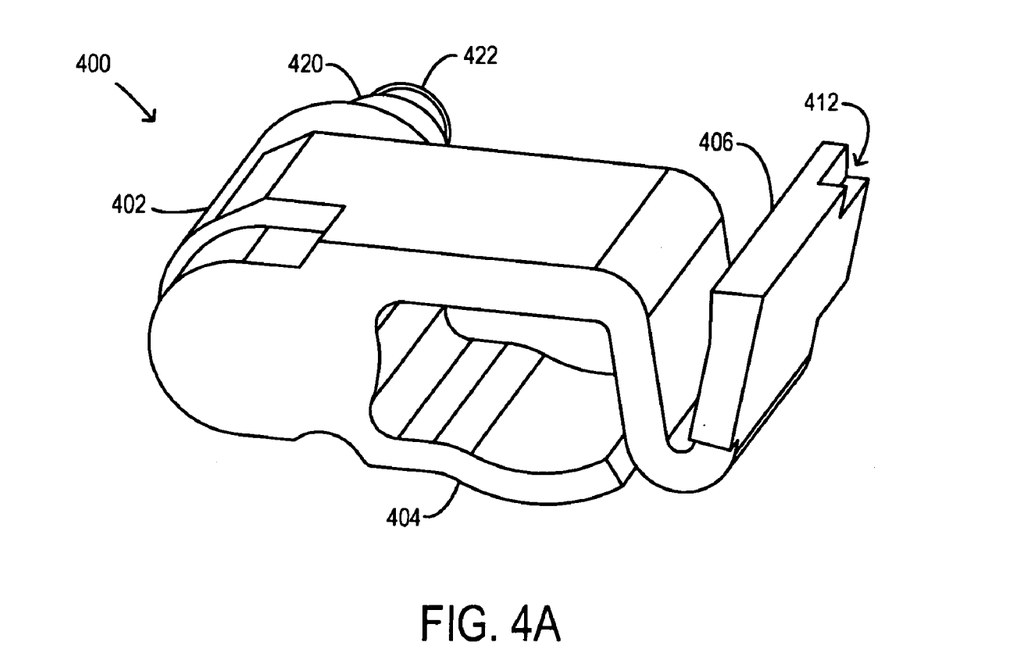
FIG. 4A is a front perspective diagram of a device according to some embodiments.
Figure 4B:
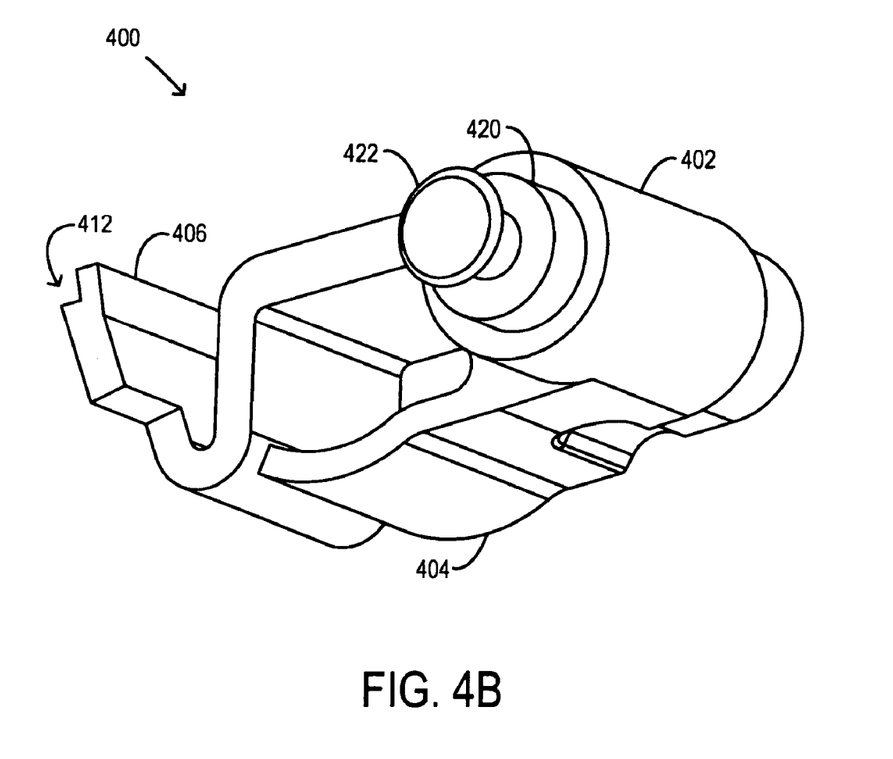
FIG. 4B is a rear perspective diagram of the device in FIG. 4A.

Turning now to FIGS. 4A and 4B, both front and rear perspective views of a device 400 are shown, respectively. In some embodiments, the device 400 may be or be similar to any of the devices 100, 200, 300 described in conjunction with FIGS. 1, FIGS. 2A and 2B, and FIGS. 3A and 3B, respectively above. The device 400 may include, according to some embodiments, a first element 402, a first pliant portion 404 connected to the first element 402, and/or a second pliant portion 406 connected to the first element 402. In some embodiments, the second pliant portion 406 may include an interface 412. According to some embodiments, the components 402, 404, 406, 412 of the device 400 may be similar in configuration and/or functionality to the similarly-named components described in relation to any of the devices 100, 200, 300 described above.

In some embodiments, the device 400 may include a second element 420. The second element 420 may, for example, be configured to couple and/or facilitate coupling of the device 400 to a computer chassis. In some embodiments, the second element 420 may be or include a projection from the first element 402 (as shown in FIGS. 4A and 4B). The second element 420 may, according to some embodiments, be or include any configuration and/or type of device, receptacle, object, and/or interface that is practicable to couple and/or facilitate coupling of the device 400 to another device and/or object, such as a computer chassis (e.g., computer chassis 134). For example, the second element 420 may include a keyed-portion 422. According to some embodiments, the keyed-portion 422 and/or the second element 420 may be removably coupled to the computer chassis. The keyed-portion 422 may, for example, be configured -to couple to a keyhole (not shown) in the computer chassis. In some embodiments, the coupling of the keyed-portion 422 and/or of the second element 420 to the computer chassis may permit the device 400 to be rotated with respect to the computer chassis.

Figure 5:
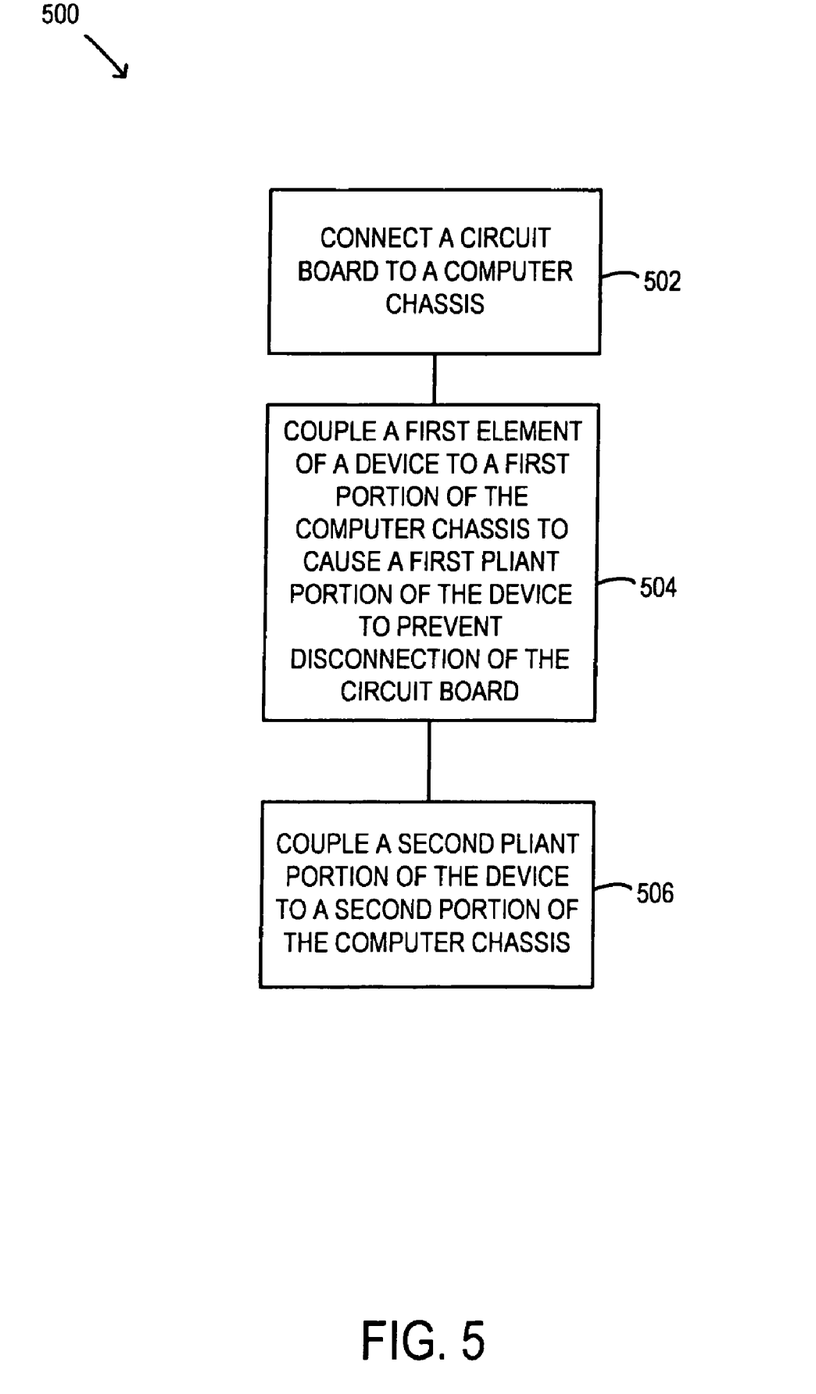
FIG. 5 is a flow diagram of a method according to some embodiments.

Referring now to FIG. 5, a method 500 according to some embodiments is shown. In some embodiments, the method 500 may be conducted by and/or by utilizing any of the devices 100, 200, 300 described above and/or may be otherwise associated with any of the devices 100, 200, 300 and/or the system 130 described above. The flow diagrams described herein do not necessarily imply a fixed order to the actions, and embodiments may be performed in any order that is practicable. Note that any of the methods described herein may be performed by hardware, software (including microcode), firmware, manual means, or any combination thereof. For example, a storage medium may store thereon instructions that when executed by a machine result in performance according to any of the embodiments described herein.

In some embodiments, the method 500 may begin at 502 to connect a circuit board to a computer chassis. The circuit board may, for example, be coupled to, connected to, attached to, mounted on, and/or otherwise associated with a portion of a computer chassis such as a mounting interface (e.g., mounting interface 134). In some embodiments, the circuit board may be or include a computer interface and/or expansion card such as a PCI or PCI-X card. The circuit board may, according to some embodiments, be physically and/or electrically coupled and/or connected to the computer chassis. For example, an electrical interface of the circuit board may be inserted into a circuit board slot within a computer, at 502. In some embodiments, one or more flanges of the circuit board may be coupled and/or mounted to portions of the computer chassis, such as to one or more mounting interfaces.

At 504, the method 500 may continue, for example, to couple a first element of a device to a first portion of the computer chassis to cause a first pliant portion of the device to inhibit disconnection of the circuit board. The device may be similar in configuration and/or functionality to, for example, any of the devices 100, 200, 300, 400 described above. In some embodiments, the first portion of the computer chassis may be or include a standoff such as a keyed-standoff.

The first element of the device may, according to some embodiments, be mounted on and/or to the standoff. In some embodiments, the first pliant portion may be positioned and/or configured to inhibit and/or prevent the circuit board from becoming disconnected. For example, the first pliant portion may apply pressure to a portion of the circuit board to inhibit substantial movement of the circuit board. In some embodiments, the first pliant portion and/or the device may be rotated with respect to the computer chassis and/or the standoff or other projection or device. For example, the device may be coupled to the computer chassis and rotated to engage the first pliant portion with the circuit board. According to some embodiments, the first pliant portion may be engaged with the circuit board by positioning the first pliant portion against, next to, adjacent to, and/or otherwise near or toward the circuit board.

In some embodiments, the method 500 may continue at 506 to couple a second pliant portion of the device to a second portion of the computer chassis. According to some embodiments, the second pliant portion may be utilized to inhibit rotation of the device and/or of the first pliant portion with respect to the computer chassis. As described above, for example, the device may be rotated to engage the first pliant portion with the circuit board. The second pliant portion may then, for example, be coupled to a second portion of the computer chassis to inhibit further rotation of the device. This may, for example, fix and/or lock the device in place with respect to the computer chassis and/or the circuit board. According to some embodiments, coupling the second pliant portion to the computer chassis may inhibit disengagement of the first pliant portion from the circuit board.

Figure 6:
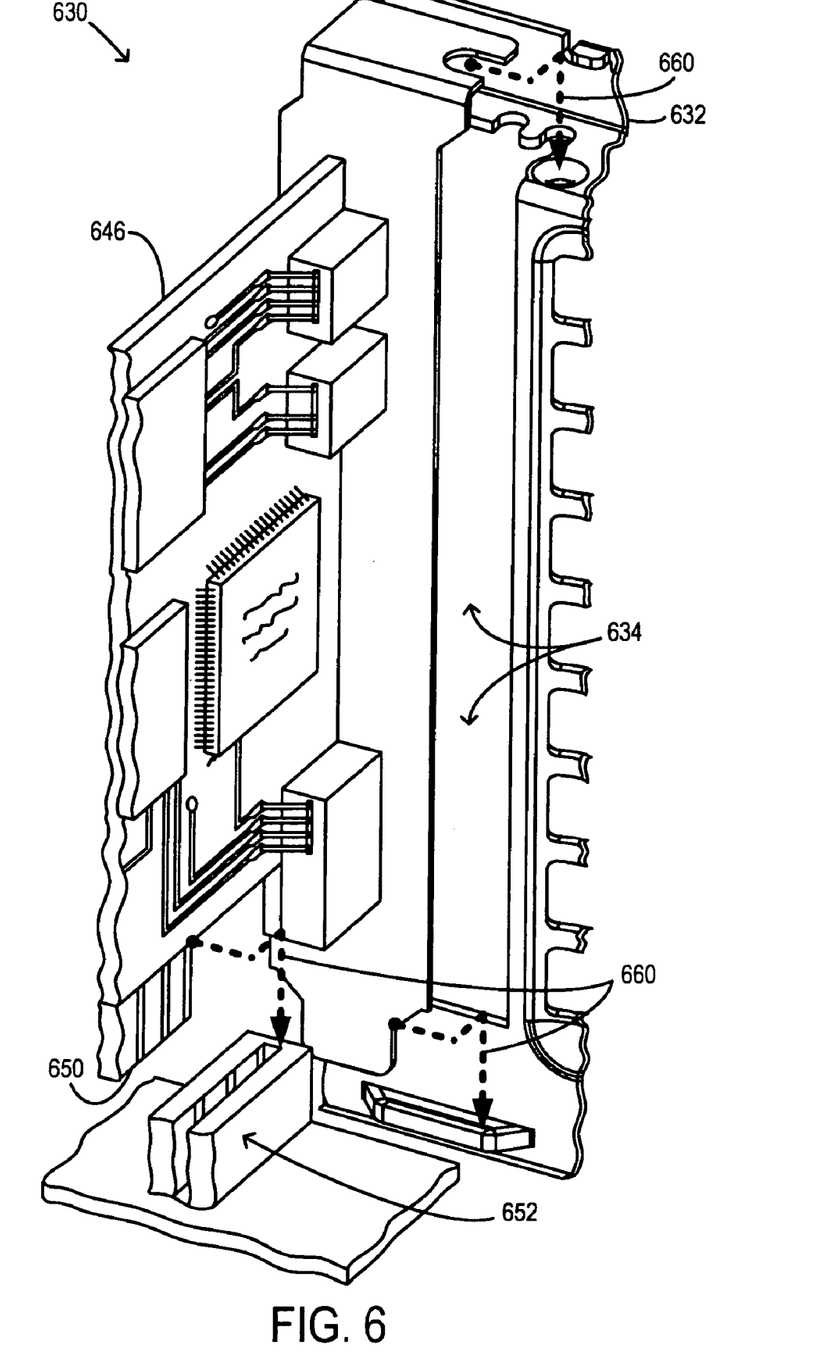
FIG. 6 is a perspective diagram of a system according to some embodiments.

FIG. 6 shows a perspective diagram of a system 630 according to some embodiments. The system 630 may, according to some embodiments, be utilized in accordance with and/or otherwise associated with the method 500 described above. In some embodiments, the system 630 may include a computer chassis 632, one or more mounting interfaces 634, a circuit board (and/or a mounting interface cover) 646 having an electrical interface 650, and/or a circuit board slot 652. In some embodiments, fewer or more components than are shown in FIG. 6 may be included in system 630. In some embodiments, system 630 may be similar to the system 130 described in conjunction with FIG. 1 above.

In some embodiments, the circuit board 646 may be connected to the computer chassis 632, at 501. The circuit board 646 may, for example, be physically coupled to the computer chassis 632 by moving a flange of the circuit board 646 (e.g., in accordance with the path 660) to couple the flange to a portion of the computer chassis 632, such as to the mounting interface 634. The circuit board 646 may also or alternatively be electrically coupled to the circuit board slot 652 by moving the electrical interface 650 (e.g., in accordance with the path 660) to couple the electrical interface 650 to the circuit board slot 652. In some embodiments, the circuit board slot 652 may be connected to, coupled to, and/or otherwise associated with the computer chassis 632.

Figure 7:
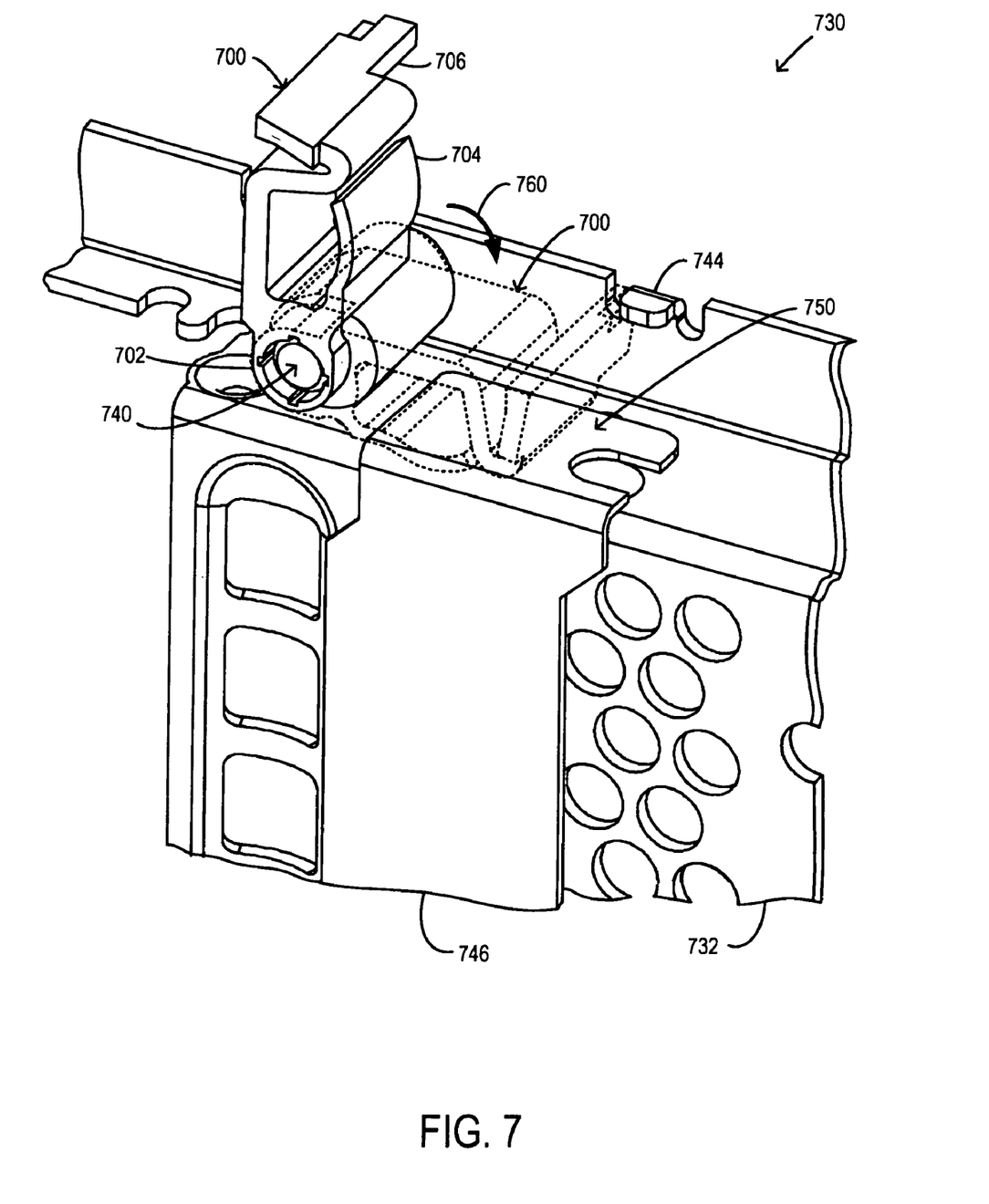
FIG. 7 is a perspective diagram of a device according to some embodiments.

Referring now to FIG. 7, a perspective diagram of a device 700 according to some embodiments is shown. The device 700 may, according to some embodiments, include a first element 702, a first pliant portion 704, and/or a second pliant portion 706. The device 700 may include fewer or more components than are shown in FIG. 7. For ease of illustration of some embodiments, the device 700 is shown in FIG. 7 in relation to a portion of a computer system 730. The device 700 and/or the system 730 may, according to some embodiments, be utilized in accordance with and/or otherwise associated with the method 500 described above. According to some embodiments, the components 702, 704, 706 of the device 700 may be similar in configuration and/or functionality to the similarly-named components described in relation to any of the devices 100, 200, 300, 400 described above. In some embodiments, the system 730 may be similar to any of the systems 130, 630 described in conjunction with FIG. 1 and FIG. 6, respectively above.

System 730 may comprise, according to some embodiments, a computer chassis 732, a projection 740, a flange 744, and/or a circuit board or mounting interface cover 746. In some embodiments, the circuit board and/or mounting interface cover 746 may include a flanged portion 750. In accordance with some embodiments (and as described herein), the device 700 may be coupled and/or mounted to the computer chassis 732 via the projection 740. In some embodiments for example, the projection 740 may be or include a keyed-standoff that is removably coupled to the first element of the device 702.

In some embodiments of 504, the device 700 may be coupled and/or mounted to the computer chassis 732 and/or positioned in a first orientation, shown as the solid-lined orientation of device 700 in FIG. 7. In such an orientation, for example, the first pliant portion 704 of the device 700 may be positioned away from the circuit board 746. Being positioned away from the circuit board 746 may, according to some embodiments, not allow the first pliant portion 704 to be engaged with the circuit board 746 and/or to inhibit disconnection of the circuit board 746.

In some embodiments of 504, the device 700 and/or the first pliant portion 704 may be rotated and/or otherwise moved, such as in accordance with path 760, to engage the first pliant portion 704 with the circuit board 746 and/or with the flange 750 of the circuit board 746. For example, the device 700 may be rotated via path 760 to a second orientation, shown as the dashed-line orientation of device 700 in FIG. 7. Such rotation may, according to some embodiments, cause the first pliant portion 704 to be positioned against, adjacent to, and/or otherwise near the flange 750. The positioning of the first pliant portion 704 near the flange 750 may, for example, inhibit substantial movement of the flange 750 and/or may inhibit disconnection of the circuit board 746.

According to some embodiments of 506, the second pliant portion 706 of the device 700 may be coupled to a portion of the computer chassis 732. When the device 700 is rotated via path 760, as described above for example, the second pliant portion 706 may engage the flange 744 of the computer chassis 732. In some embodiments, the pliancy of the first pliant portion 704 may cause the device 700 to rotate back along path 760 away from the second orientation (the dotted-line orientation of device 700). In such embodiments, the second pliant portion 706 may couple to the flange 744 when the device 700 achieves the second orientation, to inhibit the device 700 from being rotated back along path 760 away from the circuit board 746. In other words, the second pliant portion 706 may engage a portion of the computer chassis 732 to inhibit the first pliant portion 704 from becoming disengaged from the circuit board 746.

Figure 8:
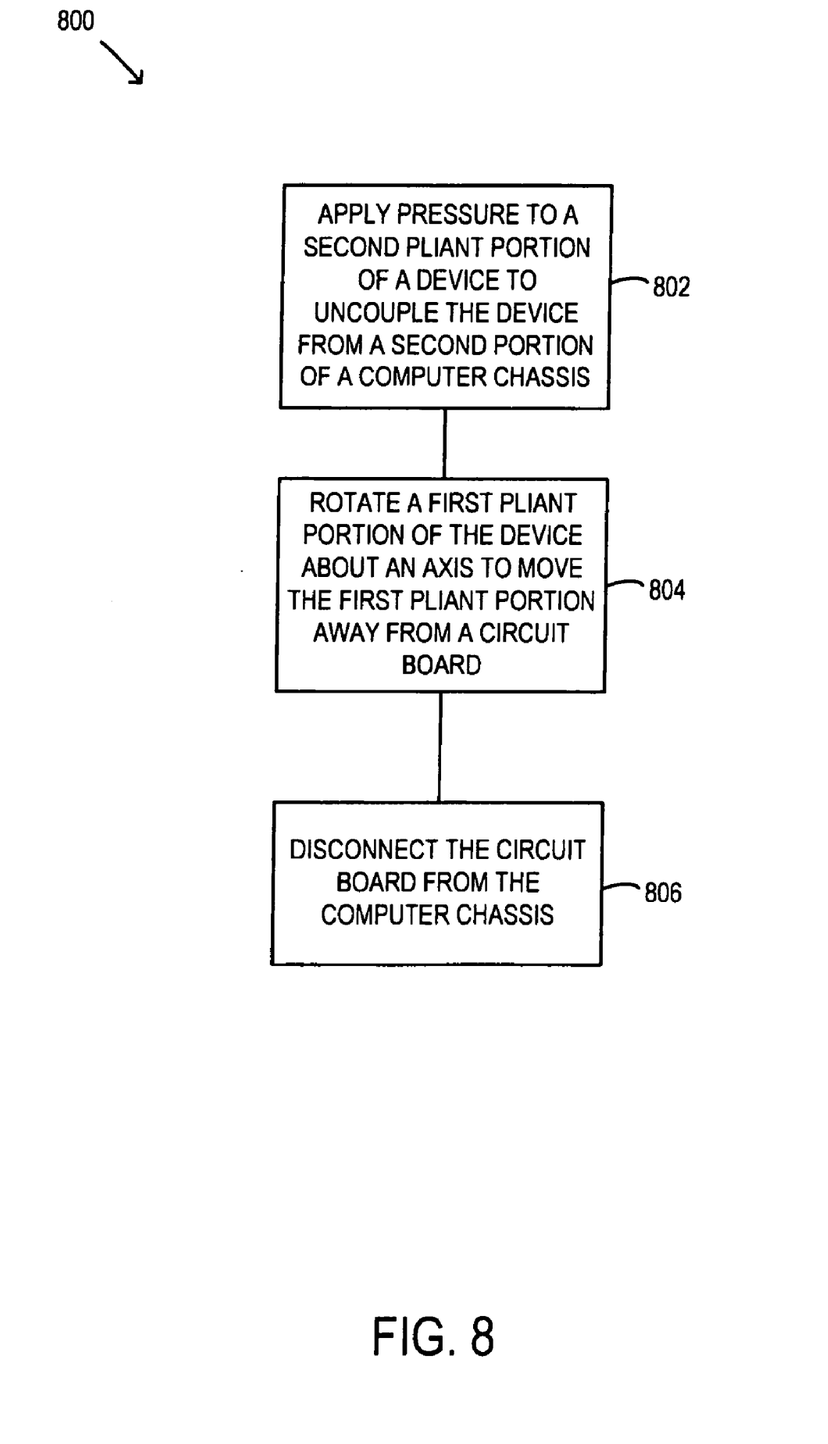
FIG. 8 is a flow diagram of a method according to some embodiments.

Referring now to FIG. 8, a method 800 according to some embodiments is shown. In some embodiments, the method 800 may be conducted by and/or by utilizing any of the devices 100, 200, 300, 400, 700 described above and/or may be otherwise associated with the devices 100, 200, 300, 400, 700 and/or any of the systems 130, 630, 730 described above. In some embodiments, the method 800 may begin at 802 to apply pressure to a second portion of a device to uncouple the device from a second portion of a computer chassis.

In some embodiments for example, the pressure applied to the second pliant portion may cause an interface of the second pliant portion to uncouple from the second portion of the computer chassis. Uncoupling the second pliant portion and/or the interface of the second pliant portion from the computer chassis may, according to some embodiments, permit the device to be rotated with respect to the computer chassis. In some embodiments, such as where the second pliant portion is coupled to the computer chassis to inhibit a tendency of the device to rotate and/or otherwise move away from a circuit board, the pressure applied to the second pliant portion may disengage the interface of the second pliant portion to allow the device to perform a rotation and/or movement in accordance with such a tendency.

At 804 for example, the method 800 may continue to rotate a first pliant portion of the device about an axis to move the first pliant portion away from a circuit board. In some embodiments, the decoupling of the second pliant portion from the computer chassis at 802 may allow the device to be rotated at 804 to disengage the first pliant portion from the circuit board. In some embodiments, the first pliant portion and/or the device may, as described above, have a tendency (e.g., due to pliancy or bias) to move and/or rotate away from the circuit board. In such embodiments, when the second pliant portion is uncoupled from the computer chassis at 802, the device and/or first pliant portion may, for example, automatically rotate and/or move away from the circuit board (e.g., in accordance with the tendency). According to some embodiments, moving the first pliant portion away from the circuit board may allow the circuit board to be disconnected and/or otherwise moved.

For example, at 806 the method 800 may continue to disconnect the circuit board from the computer chassis and/or another device (e.g., the circuit board slot 652 in FIG. 6). In some embodiments, the circuit board may not be removable and/or may not be disconnected from the computer chassis while the device is oriented such that the first pliant portion is against, adjacent to, and/or otherwise near the circuit board. For example, the first pliant portion may be initially positioned (e.g., during 802) near a flange of the circuit board such that the first pliant portion inhibits substantial movement of the flange. When the device is rotated away from the circuit board at 804 to a second position, for example, the first pliant portion may not be able to inhibit substantial movement of the flange and/or inhibit disconnection of the circuit board. In such embodiments, when the device and/or the first pliant portion is positioned away from the circuit board (and/or away from the flange of the circuit board), the circuit board may be disconnected from the computer chassis.

Figure 9:
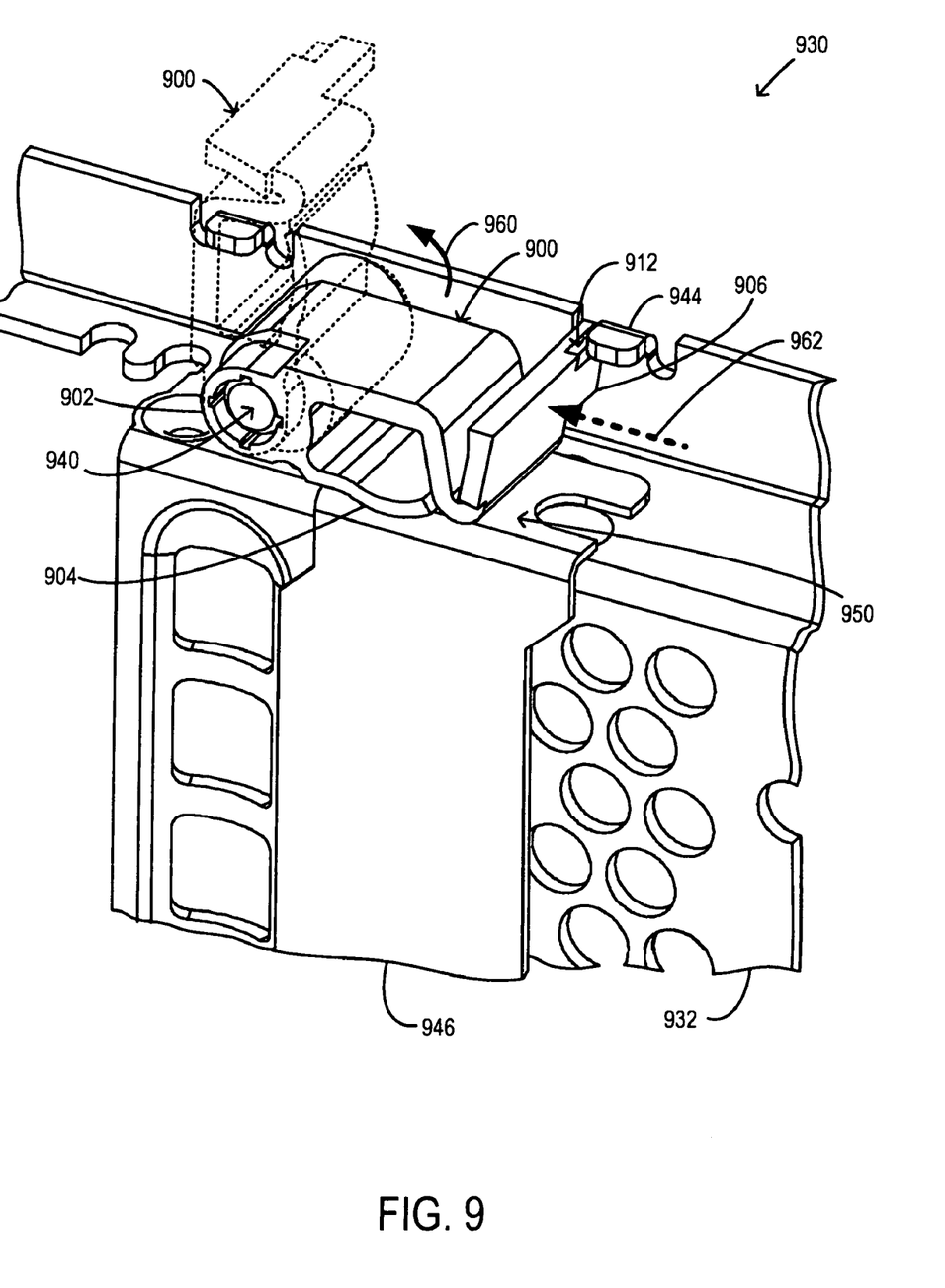
FIG. 9 is a perspective diagram of a device according to some embodiments.

Turning now to FIG. 9, a perspective diagram of a device 900 according to some embodiments is shown. The device 900 may, according to some embodiments, include a first element 902, a first pliant portion 904, and/or a second pliant portion 906. In some embodiments, the second pliant portion 906 may include and/or define an interface 912. The device 900 may, according to some embodiments, include and/or be associated with fewer or more components than are shown in FIG. 9. For ease of illustration of some embodiments, the device 900 is shown in FIG. 9 in relation to a portion of a computer system 930. The device 900 and/or the system 930 may, according to some embodiments, be utilized in accordance with and/or otherwise associated with the method 800 described above. According to some embodiments, the components 902, 904, 906, 912 of the device 900 may be similar in configuration and/or functionality to the similarly-named components described in relation to any of the devices 100, 200, 300, 400, 700 described above. In some embodiments, the system 930 may be similar to any of the systems 130, 630, 730 described in conjunction with FIG. 1, FIG. 6, and FIG. 7, respectively above.

The system 930 may comprise, according to some embodiments, a computer chassis 932, a projection 940, a flange 944, and/or a circuit board or mounting interface cover 946. In some embodiments, the circuit board and/or mounting interface cover 946 may include a flanged portion 950. In accordance with some embodiments (and as described herein), the device 900 may be coupled and/or mounted to the computer chassis 932 via the projection 940. In some embodiments for example, the projection 940 may be or include a keyed-standoff that is removably coupled to the first element of the device 902.

In some embodiments, the device 900 may be coupled and/or mounted to the computer chassis 932 and/or positioned in a first orientation, shown as the solid-lined orientation of device 900 in FIG. 9. In such an orientation, for example, the first pliant portion 904 of the device 900 may be positioned against, adjacent to, and/or otherwise near the circuit board 946 and/or the flange 950 of the circuit board 946. Being positioned near the circuit board 946 and/or the associated flange 950 may, according to some embodiments, allow the first pliant portion 904 to inhibit substantial movement of the circuit board 946 and/or the flange 950 and/or to inhibit disconnection of the circuit board 946.

According to some embodiments, the second pliant portion 906 and/or the interface 912 of the device 900 may be coupled to a portion of the computer chassis 932. When the device 900 is positioned in the first orientation, as described above for example, the second pliant portion 906 and/or the interface 912 may engage the flange 944 of the computer chassis 932. In some embodiments, the pliancy of the first pliant portion 904 may cause the device 900 to rotate (and/or tend to rotate) along path 960 away from the first orientation (the solid-line orientation of device 900). In such embodiments, the second pliant portion 906 and/or the interface 912 may couple to the flange 944 when the device 900 is positioned in the first orientation, to inhibit the device 900 from being rotated (e.g., along path 960) and/or otherwise moved away from the circuit board 946. In other words, the second pliant portion 906 and/or the interface 912 may engage a portion of the computer chassis 932 to inhibit the first pliant portion 904 from becoming disengaged from the circuit board 946.

In some embodiments of 802, pressure may be applied to the second pliant portion 906 to uncouple and/or disengage the second pliant portion 906 from the computer chassis 932 and/or from the flange 944. For example, pressure may be applied to the second pliant portion along a path 962. The pressure may cause, according to some embodiments, the pliant portion to deform, bend, and/or otherwise move away from and/or disengage from the flange 944 of the computer chassis 932. In some embodiments, such as where the second pliant portion 906 inhibits the device 900 from rotating and/or moving in accordance with a tendency away from the circuit board, the uncoupling and/or disengaging of the second pliant portion 906 may allow and/or cause the device 900 to rotate via the path 960.

In some embodiments of 802, the device 900 and/or the first pliant portion 904 may be rotated and/or otherwise moved, such as in accordance with path 960, to disengage and/or uncouple the first pliant portion 904 from the circuit board 946 and/or from the flange 950 of the circuit board 946. For example, the device 900 may be rotated via path 960 to a second orientation, shown as the dashed-line orientation of device 900 in FIG. 9. Such rotation may, according to some embodiments, cause the first pliant portion 904 to move away from the flange 950. The positioning of the first pliant portion 904 away the flange 950 may, for example, allow the flange 950 and/or the circuit board 946 to be moved and/or may allow disconnection of the circuit board 946, at 806.

Figure 10:
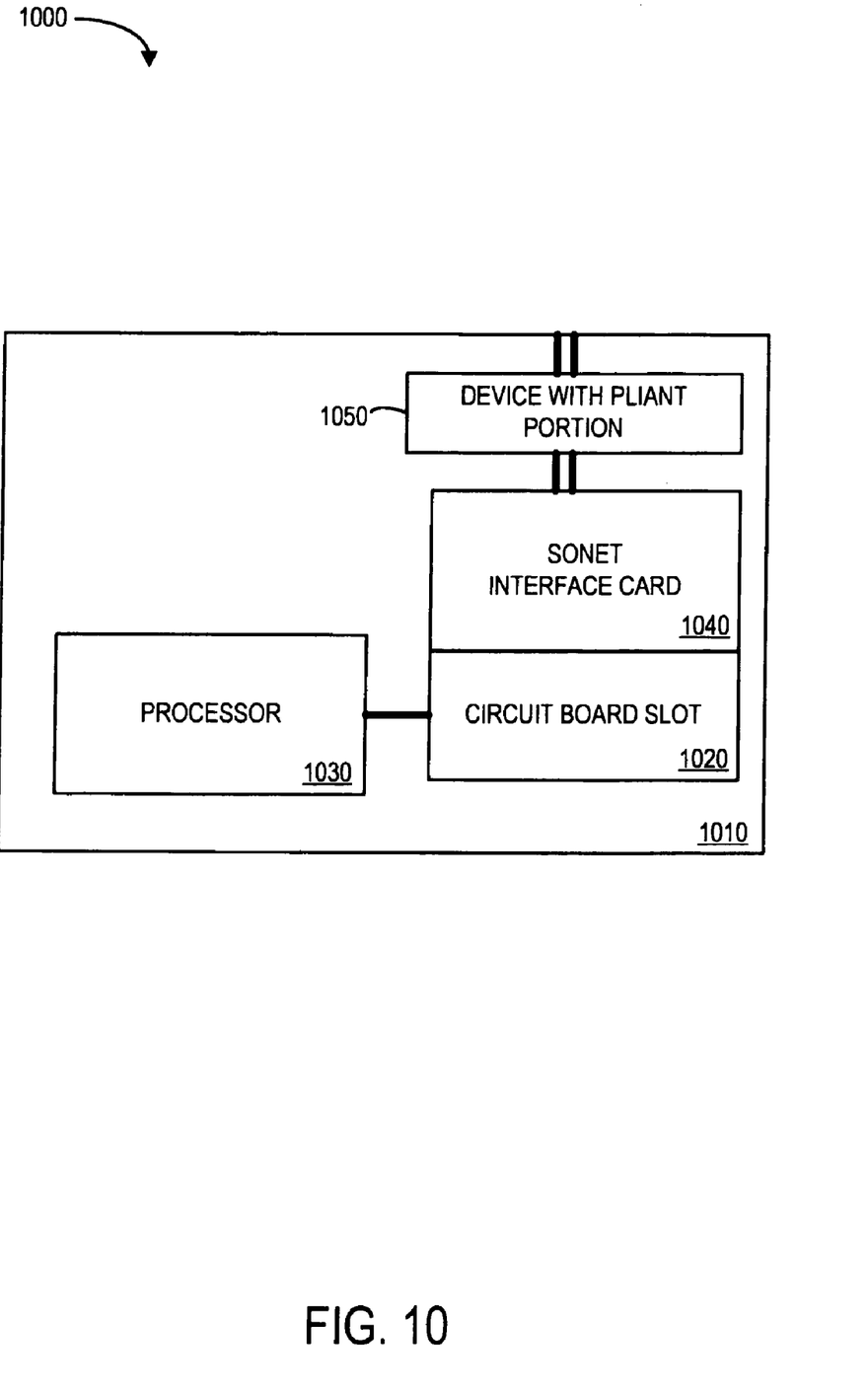
FIG. 10 is a block diagram of a system according to some embodiments.

Referring now to FIG. 10, a block diagram of a system 1000 according to some embodiments is shown. The system 1000 may include, for example, a server 1010, a circuit board slot 1020, a processor 1030, a Synchronous Optical NETwork (SONET) interface card 1040 that operates in accordance with the American National Standards Institute (ANSI) T1.105.04 "SONET-Data Communication Channel Protocol and Architectures" standard (1995; revised 2001), and/or a device 1050 with a pliant portion. The server 1010 may be any type of server that is or becomes available. In some embodiments, the server 1010 may be or include a server that has a height of substantially 4U (seven and one-half inches) or less (e.g., an IBM® eServer™ as described herein).

In some embodiments, the circuit board slot 1020 may be connected to and/or otherwise in communication with the processor 1030 and/or the SONET interface card 1040. The circuit board slot 1020 may, according to some embodiments, be or include any type and/or configuration of circuit board connector, slot, receptacle, and/or interface that is or becomes available (e.g., a PCI or PCI-X slot as described herein). The processor 1030 may be any type of processor including, but not limited to, an Intel® IXP 2800 network processor or an Intel® XEON™ Processor coupled with an Intel® E7501 chipset.

The SONET interface card 1040 may be substituted with any suitable type and/or configuration of interface, communication, and/or expansion card that is or becomes known. The SONET interface card 1040 may be or include, for example, a Network Interface Card (NIC) such as a QLogic® SANblade™ QLA2342 Host Bus Adapter (HBA). In some embodiments, the SONET interface card 1040 may be attached and/or connected to the circuit board slot 1020. The SONET interface card 1040 may, for example, be in communication with the processor 1030 through and/or utilizing the circuit board slot 1020.

According to some embodiments, the device 1050 with the pliant portion may be or include any of the devices 100, 200, 300, 400, 700, 900 described herein. The device 1050 may, for example, operate in accordance with, carry out, and/or otherwise be associated with the methods 500, 800 described herein. For example, the device 1050 may couple to the server 1010 and/or the SONET interface card 1040. In some embodiments, the device 1050 may inhibit, for example, the disconnection of the SONET interface card 1040 from the circuit board slot 1020. According to some embodiments, the device 1050 with the pliant portion may allow the securing and/or coupling of the SONET interface card 1040 to the circuit board slot 1020 and/or the server 1010 without, for example, requiring the use of tools such as a screwdriver.

Figure 11:
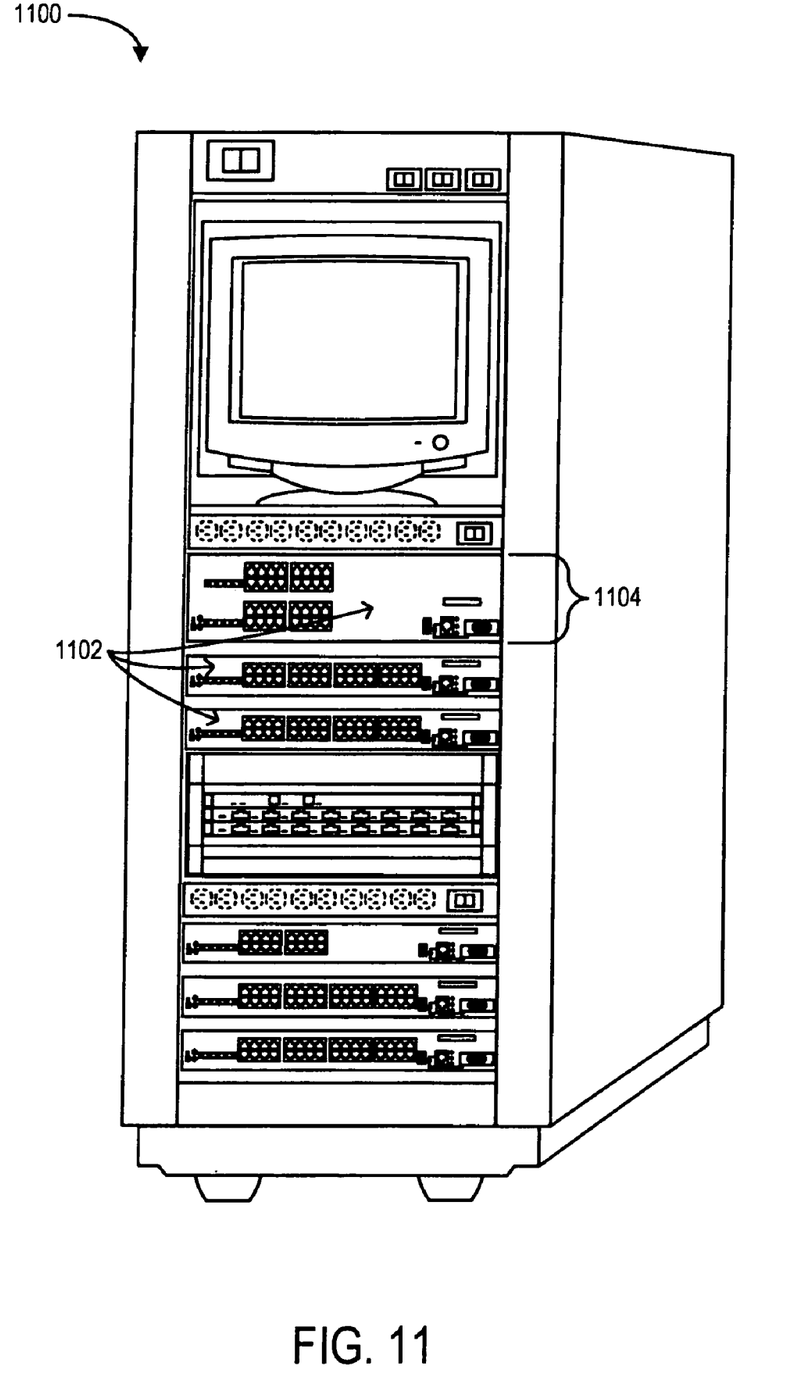
FIG. 11 is a perspective diagram of a system according to some embodiments.

Referring now to FIG. 11, a perspective diagram of a system 1100 according to some embodiments is shown. The system 1100 may be or include, for example, a rack or cabinet of servers, server-related hardware, and/or other computer-related equipment and/or devices. In some embodiments, the system 1100 may include one or more servers 1102. The servers 1102 may, according to some embodiments, vary in size and/or shape. For example, the servers 1102 may have various heights or form factors 1104. In some embodiments, some servers 1102 may, for example, have form factors 1104 substantially equal to "4U" (as described herein). In some embodiments, a server 1102 may have a form factor 1104 under "4U". According to some embodiments, any of the devices 100, 200, 300, 400, 700, 900 described herein may be included within the servers 1102. In some embodiments, the servers 1102 may have components and/or be operable in accordance with various embodiments described herein.

The various devices 100, 200, 300, 400, 700, 900 described herein may be constructed, designed, and/or manufactured using any practicable materials that are or become available. The devices 100, 200, 300, 400, 700, 900 may be fabricated, for example, of plastic, metal, and/or other composite materials and/or substances. In some embodiments, the devices 100, 200, 300, 400, 700, 900 may be manufactured via injection molding, extrusion, casting, forging, stamping, and/or any combination thereof. According to some embodiments, the devices 100, 200, 300, 400, 700, 900 may be milled, sanded, grinded, and/or otherwise constructed from a single piece of material. In some embodiments, the various components of the devices 100, 200, 300, 400, 700, 900 described herein may be constructed using differing materials and/or processes and may, for example, by joined and/or combined to operate in accordance with embodiments described herein.

The several embodiments described herein are solely for the purpose of illustration. Other embodiments may be practiced with modifications and alterations limited only by the claims.

What is claimed is:

1. A device, comprising:
   a first element to couple the device to a first portion of a computer chassis; and
   a first pliant portion coupled to the first element and to inhibit disconnection of a circuit board;
   wherein the first pliant portion may be rotated about an axis to inhibit disconnection of the circuit board;
   wherein the first pliant portion may inhibit disconnection of the circuit board by inhibiting substantial movement of a portion of the circuit board; and
   wherein the first pliant portion is to apply pressure to the portion of the circuit board.

2. The device of claim 1, wherein the portion of the circuit board is a flange.

3. The device of claim 2, wherein the flange of the circuit board is a peripheral component interconnect compliant flange.

4. The device of claim 1, further comprising:
   a second pliant portion coupled to at least one of the first element and the first pliant portion and to couple the device to a second portion of the computer chassis.

5. The device of claim 4, wherein the second pliant portion may be rotated about an axis to couple the device to the second portion of the computer chassis.

6. The device of claim 5, wherein pressure may be applied to the second pliant portion to uncouple the second portion of the computer chassis and the second pliant portion.

7. The device of claim 4, wherein the second portion of the computer chassis is a flange to couple to the second pliant portion.

8. The device of claim 1, wherein the first element comprises a protrusion to couple the device to the first portion of the computer chassis.

9. The device of claim 1, wherein the first element defines an opening to receive the first portion of the computer chassis.

10. The device of claim 1, wherein the first element defines an opening and the device further comprises a second element disposed within the opening, the second element to couple the device to the first portion of the computer chassis.

11. A system comprising:
    a computer chassis as recited in claim 1;
    a circuit board slot coupled to the computer chassis;
    a circuit board as recited in claim 1; and
    a device as recited in claim 1,
    wherein the first element of the device is secured to the computer chassis;
    wherein the first pliant portion may inhibit disconnection of the circuit board from the circuit board slot by inhibiting substantial movement of a portion of the circuit board; and
    wherein the first pliant portion is to apply pressure to the portion of the circuit board.

12. A system, comprising:
    a chassis having a circuit board slot coupled thereto;
    a circuit board having an electrical interface electrically coupled to the circuit board slot; and
    a device coupled to the chassis, the device having a first pliant portion to bias the electrical interface of the circuit board toward the circuit board slot and inhibit disconnection of the electrical interface of the circuit board from the circuit board slot.

13. The system of claim 12, wherein the device further comprises:
    a second pliant portion to removably couple the device to the chassis.

14. The system of claim 13, wherein the chassis further comprises:
    a flange to receive the second pliant portion of the device and to removably couple the device to the chassis.

15. The system of claim 12, further comprising:
    a projection coupled to the chassis, the projection to receive the device.

16. The system of claim 15, wherein the device defines an opening to receive the projection and to couple the device to the chassis.

17. The system of claim 15, wherein the projection comprises a standoff

18. The system of claim 17, wherein the standoff comprises a keyhole standoff

19. The system of claim 12, wherein the system has a height of substantially seven inches.

20. The system of claim 12, wherein the system has a height of less than seven inches.

21. A system, comprising:
a chassis having a circuit board slot coupled thereto;
a SONET interface card coupled to the circuit board slot; and
a device coupled to the chassis, the device having;
  a first pliant portion to inhibit disconnection of the SONET interface card from the circuit board slot; and
  a second pliant portion to removably couple the device to the chassis.

22. The system of claim 21, wherein the first pliant portion is to bias the SONET interface card toward the circuit board slot.

* * * * *